(12) United States Patent
Koga et al.

(10) Patent No.: US 12,184,055 B2
(45) Date of Patent: *Dec. 31, 2024

(54) ARC DETECTION DEVICE, SOLAR INVERTER, INDOOR WIRING SYSTEM, BREAKER, SOLAR PANEL, SOLAR PANEL-ATTACHED MODULE, AND JUNCTION BOX

(71) Applicant: Panasonic Intellectual Property Management Co., Ltd., Osaka (JP)

(72) Inventors: Tatsuo Koga, Osaka (JP); Yoshio Mitsutake, Nara (JP); Keita Kanamori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 244 days.

This patent is subject to a terminal disclaimer.

(21) Appl. No.: 17/908,987

(22) PCT Filed: Mar. 3, 2021

(86) PCT No.: PCT/JP2021/008297
§ 371 (c)(1),
(2) Date: Sep. 2, 2022

(87) PCT Pub. No.: WO2021/182263
PCT Pub. Date: Sep. 16, 2021

(65) Prior Publication Data
US 2023/0099131 A1    Mar. 30, 2023

(30) Foreign Application Priority Data

Mar. 11, 2020  (JP) ................................. 2020-041960

(51) Int. Cl.
*H02H 1/00* (2006.01)
*G01R 31/40* (2020.01)
(Continued)

(52) U.S. Cl.
CPC ........... *H02H 1/0015* (2013.01); *G01R 31/40* (2013.01); *H02H 7/268* (2013.01); *H02S 50/00* (2013.01)

(58) Field of Classification Search
CPC .... H02H 1/0015; H02H 7/268; H02H 7/1213; H02H 3/33; H02H 7/20; G01R 31/40;
(Continued)

(56) References Cited

U.S. PATENT DOCUMENTS 9,070,797 B2    6/2015  Burghardt et al.
11,100,828 B2 * 8/2021  Chen ....................... G09G 3/006
(Continued)

FOREIGN PATENT DOCUMENTS

EP    2120306 A2    11/2009
JP    2011-7765 A    1/2011
(Continued)

OTHER PUBLICATIONS

International Search Report for corresponding Application No. PCT/JP2021/008297, mailed May 21, 2021.
(Continued)

*Primary Examiner* — Giovanni Astacio-Oquendo
(74) *Attorney, Agent, or Firm* — Renner, Otto, Boisselle & Sklar, LLP

(57) ABSTRACT

An arc detection device includes a voltage detector connected between a first wire and a second wire to detect a voltage between the first wire and the second wire, the first wire connecting a positive electrode of a DC/DC converter and a plurality of DC/DC converters and branching from the positive electrode of the DC power source into the plurality of DC/DC converters, the second wire connecting a negative electrode of the DC/DC converter and the plurality of DC/DC converters and branching from the negative electrode of the DC/DC converter into the plurality of DC/DC (Continued)

converters; and an arc determiner that determines an occurrence of an arc based on the voltage detected by the voltage detector.

7 Claims, 4 Drawing Sheets

(51) Int. Cl.
   *H02H 7/26* (2006.01)
   *H02S 50/00* (2014.01)
(58) Field of Classification Search
   CPC ..... G01R 31/1263; G01R 31/14; H02S 50/00; H02S 50/10; H02S 40/30; Y02E 10/50
   USPC .......................................... 324/536, 512, 500
   See application file for complete search history.

(56) References Cited

U.S. PATENT DOCUMENTS

| | | | | |
|---|---|---|---|---|
| 2017/0059663 | A1* | 3/2017 | Ishikawa | H01M 8/04589 |
| 2019/0296177 | A1* | 9/2019 | Wang | H01L 31/1136 |
| 2019/0296539 | A1 | 9/2019 | Kanemaru et al. | |
| 2020/0235592 | A1* | 7/2020 | Narla | H02J 7/0031 |
| 2020/0326234 | A1* | 10/2020 | Tzeng | G01J 1/44 |
| 2023/0011371 | A1* | 1/2023 | Ohshima | H02H 3/33 |
| 2023/0126245 | A1* | 4/2023 | Kidera | H02H 1/0015 361/1 |

FOREIGN PATENT DOCUMENTS

| | | |
|---|---|---|
| JP | 2013-251981 A | 12/2013 |
| JP | 2014-134445 A | 7/2014 |
| JP | 2014-143890 A | 8/2014 |
| JP | 2015-525054 A | 8/2015 |
| JP | 2017-161242 A | 9/2017 |
| JP | 6234647 B | 11/2017 |
| WO | 2014/011392 A2 | 1/2014 |
| WO | 2019/208027 A1 | 10/2019 |

OTHER PUBLICATIONS

Written Opinion for corresponding Application No. PCT/JP2021/008297, mailed May 21, 2021.
Extended European Search Report dated Aug. 22, 2023 corresponding to European Application No. 21767679.0.
Japanese Office Action dated Aug. 29, 2023 corresponding to Japanese Patent Application No. 2022-505986.

* cited by examiner

ARC DETECTION DEVICE, SOLAR INVERTER, INDOOR WIRING SYSTEM, BREAKER, SOLAR PANEL, SOLAR PANEL-ATTACHED MODULE, AND JUNCTION BOX

TECHNICAL FIELD

The present invention relates to an arc detection device, a solar inverter, an indoor wiring system, a breaker, a solar panel, a solar panel-attached module, and a junction box.

BACKGROUND ART

Typically known is a system that convers direct current (DC) power fed from a photovoltaic (PV) panel (i.e., a solar panel) via a wire into alternating current (AC) power, using a device such as an inverter. There are reports that such a wire is damaged or broken by external factors, aging, or other reasons. Such a damage or any other problem of the wire may cause an arc (i.e., an arc discharge). Arc detection means for detecting an arc are suggested (e.g., Patent Literature (PTL) 1).

CITATION LIST

Patent Literature

[PTL 1] Japanese Unexamined Patent Application Publication No. 2011-7765

SUMMARY OF INVENTION

Technical Problem

The following situation is assumed in the future. One system includes a plurality of devices to be fed with electric power from one DC power source via a wire (hereinafter referred to as a "branch wire) branching into the plurality of devices. At this time, an arc may occur in each of the path of the branch wire before branching and the plurality of paths of the branch wire after branching. An arc detection means provided for each of the paths of the branch wire before and after branching detects an arc in the corresponding one of the paths before and after branching, which increases however the size of the system and costs.

To address the problem, the present invention provides an arc detection device, for example, capable of easily detecting an arc occurring in a branch wire.

Solution to Problem

An arc detection device according to an aspect of the present invention includes: a voltage detector connected between a first wire and a second wire to detect a voltage between the first wire and the second wire, the first wire connecting a positive electrode of a direct current (DC) power source and a plurality of devices and branching from the DC power source into the plurality of devices, the second wire connecting a negative electrode of the DC power source and the plurality of devices and branching from the DC power source into the plurality of devices; and an arc determiner that determines an occurrence of an arc based on the voltage detected by the voltage detector.

A solar inverter according to an aspect of the present invention includes: the arc detection device described above; and a converter that converts electric power output from the DC power source.

An indoor wiring system according to an aspect of the present invention includes: the arc detection device described above; the first wire; the second wire; and the plurality of devices placed indoors.

A breaker according to an aspect of the present invention includes the arc detection device described above. The breaker blocks a current flowing through each of the first wire and the second wire, when an occurrence of an arc is determined.

A solar panel according to an aspect of the present invention includes the arc detection device described above. The solar panel generates electricity from sunlight.

A solar panel-attached module according to an aspect of the present invention includes the arc detection device described above. The solar panel-attached module converts a signal output from a solar panel.

A junction box according to an aspect of the present invention includes the arc detection device described above. The junction box connects a solar panel and a solar inverter.

Advantageous Effects of Invention

An aspect of the present invention allows easier detection of an arc occurring in a branch wire.

DESCRIPTION OF EMBODIMENTS

Now, embodiments of the present invention will be described with reference to the drawings. The embodiments described below are specific examples of the present invention. The numerical values, shapes, materials, constituent elements, the arrangement and connection of the constituent elements etc. shown in the following embodiments are thus mere examples and are not intended to limit the scope of the present invention.

The figures are schematic representations and not necessarily drawn strictly to scale. In the figures, substantially the same constituent elements are assigned with the same reference marks, and redundant descriptions will be omitted or simplified.

Embodiment 1

Figure 1:
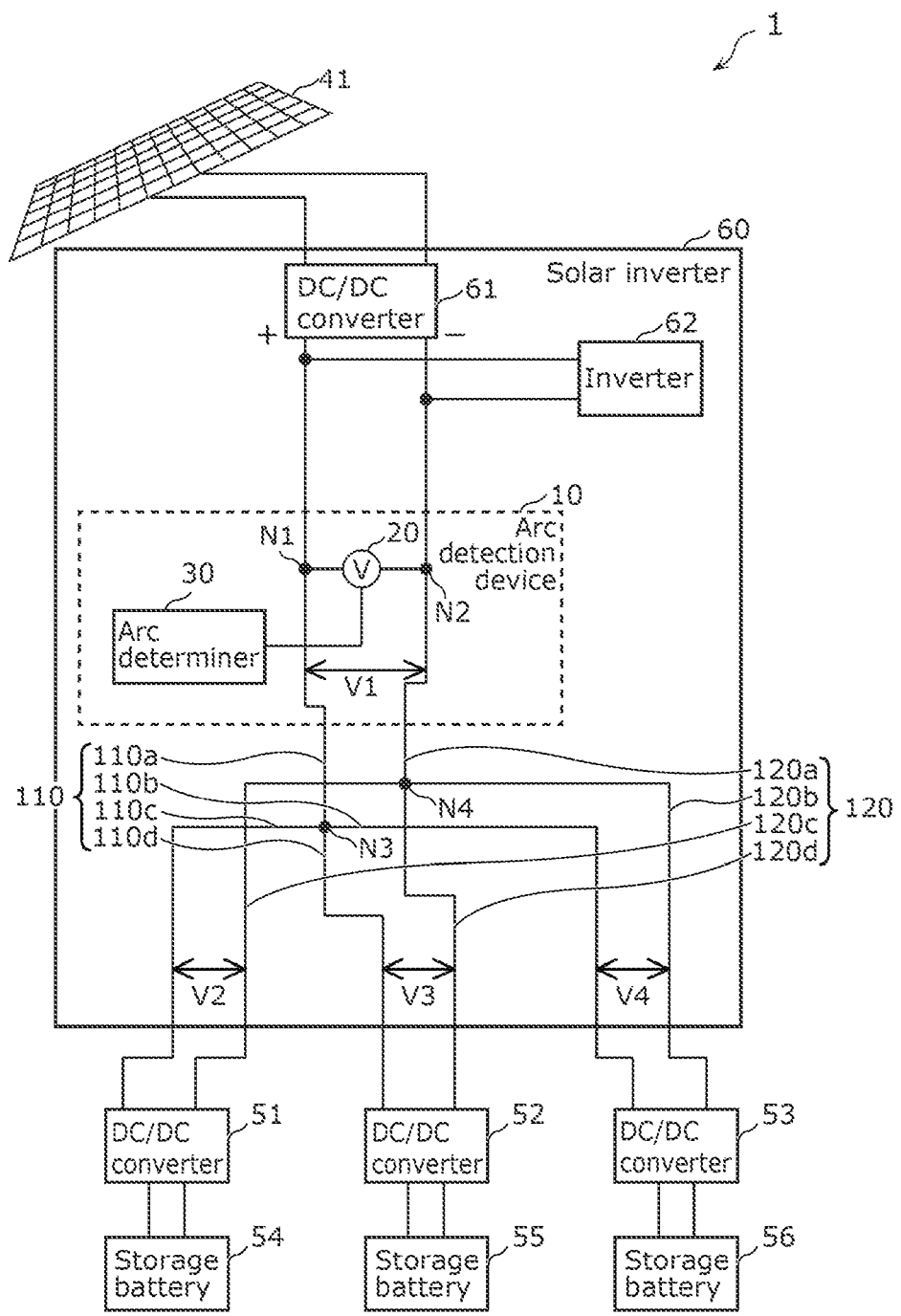
FIG. 1 is a configuration diagram showing an example solar power system according to Embodiment 1.

FIG. 1 is a configuration diagram showing example solar power system 1 according to Embodiment 1.

Solar power system 1 includes solar panel 41, storage batteries 54, 55, and 56, DC/DC converters 51, 52, and 53 as well as solar inverter 60.

Solar panel 41 generates electricity, that is, DC power from sunlight. The DC power generated by solar panel 41 is fed to solar inverter 60.

Storage battery 54 is charged with the DC power from DC/DC converter 51, storage battery 55 is charged with the DC power from DC/DC converter 52, and storage battery 56 is charged with the DC power from DC/DC converter 53. For example, storage batteries 54, 55, and 56 may be mounted on an electric vehicle or an electric bicycle, or may be used for feeding electric power to household or other electronic devices.

DC/DC converters 51, 52, and 53 are each a voltage converter that raises or lowers the DC voltage of the fed DC power and outputs the resultant DC power. DC/DC converter 51 raises or lowers the voltage of the DC power fed from solar inverter 60 and outputs the resultant DC power to storage battery 54. DC/DC converter 52 raises or lowers the voltage of the DC power fed from solar inverter 60 and outputs the resultant DC power to storage battery 55. DC/DC converter 53 raises or lowers the voltage of the DC power fed from solar inverter 60 and outputs the resultant DC power to storage battery 56.

Solar inverter 60 functions to convert the DC power fed from solar panel 41 into AC power. Solar inverter 60 also functions to feed the DC power fed from solar panel 41 to a storage battery or other components without converting the DC power into AC power. Solar inverter 60 includes DC/DC converter 61, inverter 62, and arc detection device 10.

DC/DC converter 61 raises or lowers the voltage of the DC power fed from solar panel 41 and outputs the resultant DC power to DC/DC converters 51, 52, and 53 as well as inverter 62. Outputting the DC power, DC/DC converter 61 can be regarded as a DC power source. That is, DC/DC converter 61 is an example of the "DC power source". DC/DC converter 61 includes a positive electrode and a negative electrode. The positive electrode is connected to wire 110, while the negative electrode is connected to wire 120.

Wires 110 and 120 connect DC/DC converter 61 and DC/DC converters 51, 52, and 53. Wire 110 is an example of the "first wire" connecting the positive electrode of DC/DC converter 61 and a plurality of devices. Wire 120 is an example of the "second wire" connecting the negative electrode of DC/DC converter 61 and the plurality of devices. DC/DC converters 51, 52, and 53 are examples of the "plurality of devices" connected to DC/DC converter 61 via wires 110 and 120.

Wire 110 branches from the positive electrode of DC/DC converter 61 into DC/DC converters 51, 52, and 53. The point at which wire 110 branches from the positive electrode of DC/DC converter 61 into DC/DC converters 51, 52, and 53 is referred to as "branch point N3".

Wire 110 includes the following paths. The path before branching, which connects branch point N3 and the positive electrode of DC/DC converter 61, is referred to as "path 110a". One of the paths after branching, which connects branch point N3 and DC/DC converter 51, is referred to as "path 110c". One of the paths after branching, which connects branch point N3 and DC/DC converter 52, is referred to as "path 110d". One of the paths after branching, which connects branch point N3 and DC/DC converter 53" is referred to as "path 110b".

Wire 120 branches from the negative electrode of DC/DC converter 61 into DC/DC converters 51, 52, and 53. The point at which wire 120 branches from the negative electrode of DC/DC converter 61 into DC/DC converters 51, 52, and 53 is referred to as "branch point N4".

Wire 120 includes the following paths. The path before branching, which connects branch point N4 and the negative electrode of DC/DC converter 61, is referred to as "path 120a". One of the paths after branching, which connects branch point N4 and DC/DC converter 51, is referred to as "path 120c". One of the paths after branching, which connects branch point N4 and DC/DC converter 52, is referred to as "path 120d". One of the paths after branching, which connects branch point N4 and DC/DC converter 53" is referred to as "path 120b".

Inverter 62 converts the DC power fed from DC/DC converter 61 into AC power and outputs the resultant AC power. Inverter 62 employs, for example, maximum power point tracking (MPPT) and adjusts the current and voltage of the DC power fed from DC/DC converter 61 so that the electric power is a maximum value. For example, inverter 62 converts DC power into AC power with a voltage of 100V and a frequency of 50 Hz or 60 Hz. The AC power is used for household or other electronic devices.

Wires 110 and 120 are each a branch wire. An arc may occur in each of the path of each branch wire before branching and the plurality of paths of each branch wire after branching. An arc detection means provided for each of the paths of each branch wire before and after branching detects an arc in the corresponding one of the paths before and after branching, which increases however the size of the system and costs.

To address the problem, arc detection device 10 is used to easily detect an arc occurring in each of branch wires (e.g., wires 110 and 120 here).

Arc detection device 10 includes voltage detector 20 and arc determiner 30.

Voltage detector 20 is connected between wires 110 and 120 to detect a voltage between wires 110 and 120. Voltage detector 20 is a voltmeter, for example. A voltage detected by voltage detector 20 is input to arc determiner 30. Note that voltage detector 20 is connected between path 110a in wire 110 and path 120a in wire 120 (i.e., node N1 is located on path 110a and node N2 is located on path 120a). The configuration is not limited thereto. For example, node N1 may be located on path 110b, 110c, or 110d and node N2 may be located on path 120b, 120c, or 120d.

Arc determiner 30 is a microcontroller, for example. The microcontroller is a semiconductor integrated circuit or any other suitable device including a ROM and/or a RAM storing programs, a processor (e.g., a central processing unit (CPU)) for executing the programs, a timer, an A/D converter, a D/A converter, and other components. Arc determiner 30 may be implemented as hardware by a dedicated electronic circuit including an A/D converter, a logic circuit, a gate array, a D/A converter, and other components.

Arc determiner 30 determines the occurrence of an arc based on a voltage detected by voltage detector 20. For example, arc determiner 30 performs frequency analysis of a voltage detected by voltage detector 20 to determine the occurrence of an arc in wire 110 or 120. A voltage, on which a high frequency component caused by the occurrence of the arc is superimposed, contains a frequency component caused by the arc. By detecting the frequency component, the occurrence of the arc can be determined. When arc determiner 30 determines the occurrence of an arc, it is clear that the arc occurs in any of wires 110 and 120. That is, only one voltage detector (e.g., voltmeter) 20 suffices to detect an arc in each of the branch wires (e.g., wires 110 and 120 here).

The fact that an arc occurring in any of the path of each of wires 110 and 120 before branching and the plurality of paths of each of wires 110 and 120 after branching can be detected using one voltage detector 20 will be described with reference to FIG. 2.

Figure 2:
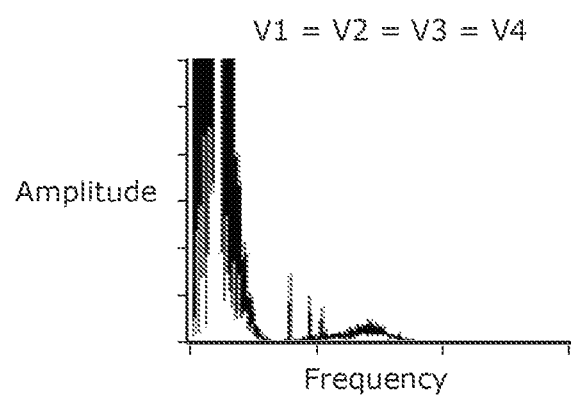
FIG. 2 illustrates that voltages between paths are the same before and after branching.

FIG. 2 illustrates that voltages between paths before and after branching are the same. FIG. 2 shows frequency spectra of voltage V1 between paths 110a and 120a, voltage V2 between paths 110c and 120c, voltage V3 between paths 110*d* and 120*d*, and voltage V4 between paths 110*b* and 120*b* in FIG. 1 at the occurrence of an arc in path 110*a*. The frequency spectra of voltages V1, V2, V3, and V4 are substantially the same as shown in FIG. 2. This is because the voltages between wires 110 and 120 are substantially the same without being influenced by the branching of the wires, even if the voltages are measured in any of the following points. The points are between the paths (e.g., between paths 110*a* and 120*a*) before branching, between the paths (e.g., between paths 110*b* and 120*b*) after branching, and between the paths (e.g., between paths 110*a* and 120*b*) before and after branching.

Accordingly, an arc occurring in any of the path of each of wires 110 and 120 before branching and the plurality of paths of each of wires 110 and 120 after branching can be detected using one voltage detector 20.

As described above, arc detection device 10 according to this embodiment includes voltage detector 20 connected between a first wire (e.g., wire 110) and a second wire (e.g., wire 120) to detect a voltage between the first wire and the second wire, the first wire connecting a positive electrode of a DC power source (e.g., DC/DC converter 61) and a plurality of devices (e.g., DC/DC converters 51, 52, and 53) and branching from the DC power source into the plurality of devices, the second wire connecting a negative electrode of the DC power source and the plurality of devices and branching from the DC power source into the plurality of devices; and arc determiner 30 that determines an occurrence of an arc based on the voltage detected by voltage detector 20.

With this configuration, assume that an arc occurs in any of the path of each of the first and second wires before branching and the plurality of paths of each of the first and second wires after branching (e.g., path 110*a*, 110*b*, 110*c*, 110*d*, 120*a*, 120*b*, 120*c*, and 120*d*). Even in this case, voltage detector 20, which detects a voltage between the first and second wires, detects a voltage on which a high frequency component caused by the occurrence of the arc is superimposed. Based on the voltage, the arc can be detected. That is, an arc occurring in a branch wire can be detected without providing an arc detection means to each of the path of each branch wire before branching and the plurality of paths of each branch wire after branching. Accordingly, an arc occurring in a branch wire can be easily detected using one voltage detector 20 without increasing the size of the system or costs. For example, upon detection of an arc, DC/DC converter 61 and inverter 62 are stopped or a breaker or any other component (not shown) in each wire is controlled based on the detection result. Then, a current flowing through each wire can be blocked.

Solar inverter 60 according to this embodiment includes arc detection device 10 and a converter (e.g., inverter 62) that converts electric power output from DC power source.

This configuration provides solar inverter 60 capable of easily detecting an arc occurring in a branch wire.

Embodiment 2

In Embodiment 1, an example has been described where the arc detection device is included in a solar power system (specifically, a solar inverter). The arc detection device may be included in an indoor wiring system. This will be described with reference to FIG. 3.

Figure 3:
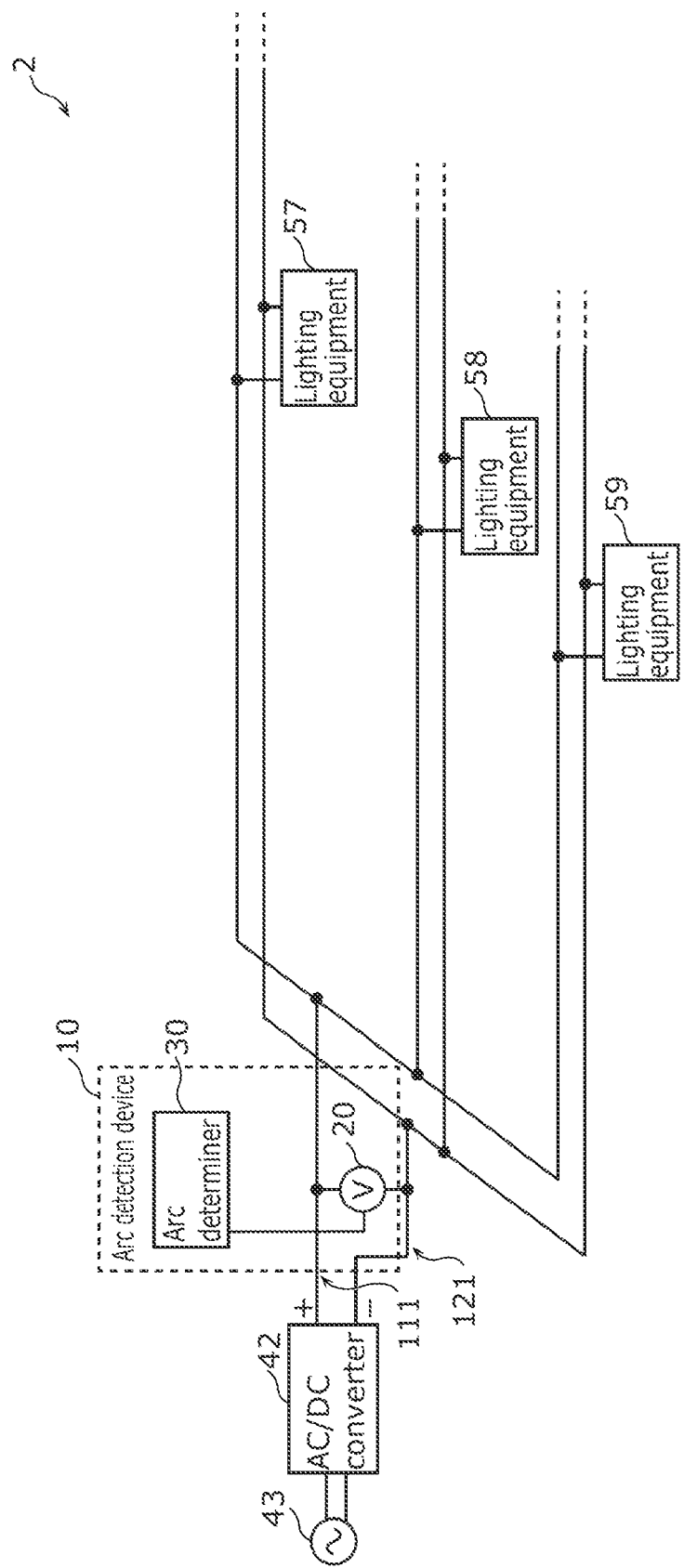
FIG. 3 is a configuration diagram showing an example indoor wiring system according to Embodiment 2.

FIG. 3 is a configuration diagram showing example indoor wiring system 2 according to Embodiment 2. Note that FIG. 3 also shows system power source 43 connected to indoor wiring system 2.

System power source 43 feeds AC power generated by a power plant or other facilities.

Indoor wiring system 2 includes AC/DC converter 42, wires 111 and 121, lighting equipment 57, 58, and 59 as well as arc detection device 10. AC/DC converter 42, wires 111 and 121, lighting equipment 57, 58, and 59 as well as arc detection device 10 are placed indoors in a facility such as a detached house, an apartment building, a building, or a factory.

AC/DC converter 42 is an electric power converter that is fed with AC power from system power source 43, converts the fed AC power into DC power, and outputs the resultant PC power. Outputting DC power, AC/DC converter 42 can be regarded as a DC power source.

AC/DC converter 42 converts the AC power fed from system power source 43 into DC power and outputs the resultant DC power to lighting equipment 57, 58, and 59. AC/DC converter 42 includes a positive electrode and a negative electrode. The positive electrode is connected to wire 111, while the negative electrode is connected to wire 121.

Wires 111 and 121 connect AC/DC converter 42 and lighting equipment 57, 58, and 59. Wire 111 is an example of the "first wire" connecting the positive electrode of AC/DC converter 42 and a plurality of devices. Wire 121 is an example of the "second wire" connecting the negative electrode of AC/DC converter 42 and the plurality of devices. Lighting equipment 57, 58, and 59 are examples of the "plurality of devices" connected to AC/DC converter 42 via wires 111 and 121.

Like wire 110 according to Embodiment 1, wire 111 branches from the positive electrode of AC/DC converter 42 into lighting equipment 57, 58, and 59. Like wire 120 according to Embodiment 1, wire 121 branches from the negative electrode of AC/DC converter 42 into lighting equipment 57, 58, and 59.

Note that the plurality of devices are not limited to lighting equipment. As long as being placed indoors, the plurality of devices are not particularly limited. For example, the plurality of device may be speakers, microphones, or other devices.

Wires 111 and 121 are each a branch wire. An arc may occur in each of the path of each branch wire before branching and the plurality of paths of each branch wire after branching. An arc detection means provided for each of the paths of each branch wire before and after branching detects an arc in the corresponding one of the paths before and after branching, which increases however the size of the system and costs.

To address the problem, arc detection device 10 is used to easily detect an arc occurring in each of branch wires (e.g., wires 111 and 121 here).

Arc detection device 10 includes voltage detector 20 and arc determiner 30.

Voltage detector 20 is connected between wires 111 and 121 to detect a voltage between wires 111 and 121.

Arc determiner 30 determines the occurrence of an arc based on a voltage detected by voltage detector 20. Arc determiner 30 has the same function as in Embodiment 1 and description thereof will thus be omitted.

In indoor wiring system 2 as well, the voltages between wires 111 and 121 are substantially the same, even if the voltages are measured in any of the points between the paths before branching, between the paths after branching, and between the paths before and after branching. Accordingly, an arc occurring in any of the path of each of wires 111 and 121 before branching and the plurality of paths of each of wires 111 and 121 after branching can be detected using one voltage detector 20.

As described above, indoor wiring system 2 according to this embodiment includes arc detection device 10, a first wire (e.g., wire 111), a second wire (e.g., wire 121), and a plurality of devices (e.g., lighting equipment 57, 58, and 59) placed indoors.

In this manner, arc detection device 10 may be applied to indoor wiring system 2 to provide indoor wiring system 2 capable of easily detecting an arc occurring in a branch wire.

Other Embodiments

While the arc detection device, for example, according to the embodiments has been described above, the present invention is not limited to the embodiments.

For example, an example has been described above in the embodiments where the arc detection device is applied to a solar power system (specifically, a solar inverter) and an indoor wiring system, an example application is not limited thereto. Another example application of the detection device (i.e., an arc detection device capable of easily detecting an arc occurring in a branch wire) according to the present invention will be described with reference to FIG. 4.

Figure 4:
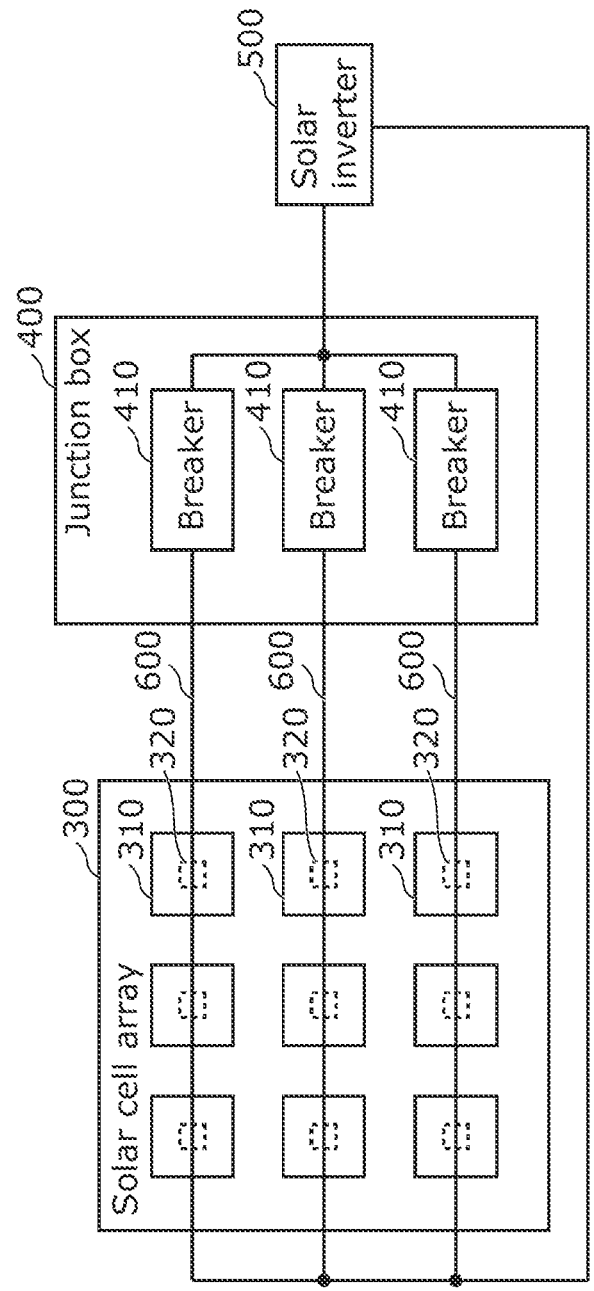
FIG. 4 illustrates an example application of the arc detection device according to the present invention.

FIG. 4 illustrates an example application of the arc detection device according to the present invention.

The arc detection device according to the present invention is, for example, applied to each component of a system that converts DC power fed from solar panels 310 via wires into AC power in solar inverter 500. Here, a plurality of (e.g., three) wires (strings) 600 each connecting a plurality of (e.g., three) solar panels 310 in series are arranged to form solar cell array 300. The plurality of wires 600 are collected by junction box 400 so as to be connected to solar inverter 500. Each solar panel 310 is the DC power source. Each wire 600 connected to the positive electrode of corresponding solar panel 310 is the first wire. Each wire 600 connected to the negative electrode of corresponding solar panel 310 is the second wire. Wires 600 branch inside solar inverter 500.

For example, wires 600 are provided with respective breakers 410. Here, breakers 410 are located inside junction box 400. Note that breakers 410 are not necessarily located inside junction box 400. For example, breakers 410 may be interposed between junction box 400 and solar cell array 300 and may be interposed between junction box 400 and solar inverter 500 without being provided for respective wires 600.

Each solar panel 310 includes, for example, solar panel-attached module 320 that converts a signal output from solar panel 310. Solar panel-attached module 320 is, for example, a DC/DC converter that controls the amount of power to be generated by each solar panel 310 most suitably. Note that each solar panel 310 not necessarily includes solar panel-attached module 320.

For example, each breaker 410 may include an arc detection device. Each breaker 410 blocks a current flowing through corresponding wire 600 upon determination of an anomaly.

For example, each solar panel 310 or solar panel-attached module 320 may include an arc detection device. Each solar panel 310 or solar panel-attached module 320 stops output to corresponding wire 600 upon determination of the occurrence of an arc.

For example, junction box 400 may include an arc detection device. Junction box 400 blocks a current flowing through each wire 600, for example, via corresponding breaker 410 or any other suitable element upon determination of the occurrence of an arc.

Note that an application of the arc detection device according to the present invention is not limited thereto. The arc detection device is widely applicable to systems requiring detection of an arc.

In this manner, each breaker 410 may include the arc detection device and block a current flowing through each of first and second wires upon determination of the occurrence of an arc. Each solar panel 310 may include the arc detection device and generate electricity from sunlight. Each solar panel-attached module 320 may include the arc detection device and convert a signal output from solar panel 310. Junction box 400 may include the arc detection device and connect solar panels 310 and solar inverter 500.

For example, an arc determiner included in the arc detection device may be implemented as software in a general-purpose computer such as a personal computer.

Besides, the present invention includes forms obtained by various modifications to the foregoing embodiments that can be conceived by those skilled in the art or forms achieved by freely combining the constituent elements and functions in the foregoing embodiments without departing from the scope and spirit of the present invention.

The invention claimed is:

1. An arc detection device comprising:
a voltage detector connected between a first wire and a second wire to detect a voltage between the first wire and the second wire, the first wire connecting a positive electrode of a direct current (DC) power source and a plurality of devices and branching from the DC power source into the plurality of devices, the second wire connecting a negative electrode of the DC power source and the plurality of devices and branching from the DC power source into the plurality of devices; and
an arc determiner that determines an occurrence of an arc based on the voltage detected by the voltage detector.

2. A solar inverter comprising:
the arc detection device according to claim 1; and
a converter that converts electric power output from the DC power source.

3. An indoor wiring system comprising:
the arc detection device according to claim 1;
the first wire;
the second wire; and
the plurality of devices placed indoors.

4. A breaker comprising the arc detection device according to claim 1, wherein
the breaker blocks a current flowing through each of the first wire and the second wire, when an occurrence of an arc is determined.

5. A solar panel comprising the arc detection device according to claim 1, wherein
the solar panel generates electricity from sunlight.

6. A solar panel-attached module comprising the arc detection device according to claim 1, wherein
the solar panel-attached module converts a signal output from a solar panel.

7. A junction box comprising the arc detection device according to claim 1, wherein
the junction box connects a solar panel and a solar inverter.

* * * * *